(12) United States Patent
Wever et al.

(10) Patent No.: US 6,341,364 B1
(45) Date of Patent: Jan. 22, 2002

(54) COMPUTER ASSISTED METHOD OF PARTITIONING AN ELECTRICAL CIRCUIT

(75) Inventors: Utz Wever, München; Qinghua Zheng, Taufkirchen; Norbert Fröhlich, Augsburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/308,304

(22) PCT Filed: Nov. 6, 1997

(86) PCT No.: PCT/DE97/02588

§ 371 Date: May 17, 1999

§ 102(e) Date: May 17, 1999

(87) PCT Pub. No.: WO98/22896

PCT Pub. Date: May 28, 1998

(30) Foreign Application Priority Data

Nov. 18, 1996 (DE) .......................................... 196 47 620

(51) Int. Cl.$^7$ .............................................. G06F 17/50
(52) U.S. Cl. ............................................................ 716/7
(58) Field of Search ............................................... 716/7

(56) References Cited

U.S. PATENT DOCUMENTS

| | | | | |
|---|---|---|---|---|
| 5,341,308 A | * | 8/1994 | Mendel | 716/7 |
| 6,080,204 A | * | 6/2000 | Mendel | 716/7 |
| 6,189,130 B1 | * | 2/2001 | Gofman et al. | 716/7 |

OTHER PUBLICATIONS

G. Sig. *Analytical Placement: A Linear or a Quadratic Objective Function?*, Proceedings of the 28$^{th}$ ACM/IEEE DAC (1991), pp. 427–432.

P. Johannes, *Partitioning of VLSI Circuits and Systems*, 33$^{rd}$ Design and Automation Conference, Las Vagas (Jun. 3–7, 1996), pp. 83–87.

L. Hagen, et al., *Fast Spectral Methods for Ratio Cut Partitioning and Clustering*, IEEE/ACM International Conference on Computer Aided Design (1991), pp. 10–13.

T. Kage, et al., *A Circuit Partitioning Approach for Parallel Circuit Simulation*, IEICE Trans Fundamentals, vol. E77–A, No. 31 (1993), pp. 461–65.

G. Hung, et al., *Improving the Performance of Parallel Relaxation–Based Circuit Simulators*, IEEE Transactions on Computer–Aided Design of Integrated Circuits and Systems, New York (Nov. 12, 1993), No. 11, pp. 1762–74.

I. Hoefer, et al., *SPICE Analyseprogramm fur elektronische Schaltungen, Springer*, Berlin (1985), pp. 7–22.

U. Kleis, et al., *Domain Decomposition Methods for Circuit Simulation*, Proceedings of the 8$^{th}$ Workshop on Parallel and Distributed Simulation, PADS, Edinburgh, UK (Jul. 1994), pp. 183–86.

U. Wever, et al. *Parallel Transient Analysis for Circuit Simulation*, Proceedings of the 29$^{th}$ Annual Hawaii International Conference on System Sciences (1946), pp. 442–47.

B. Riess, et al., *Partitioning Very Large Circuits Using Analytical Placement Techniques*, Proceedings of the 31$^{st}$ ACM/IEEE Design Automation Conference (1994), pp. 646–51.

J. Li, et al., *New Spectral Linear Placement and Clustering Approach*, 33$^{rd}$ Design Automation Conference, Las Vegas (Jun. 3–7, 1996), pp. 88–93.

* cited by examiner

Primary Examiner—Trong Phan
(74) Attorney, Agent, or Firm—Schiff Hardin & Waite

(57) ABSTRACT

A partition of an electrical circuit is formed in that the electrical circuit is mapped on a graph (102), and the nodes and/or edges of the graph are assigned weight values (103). The weight values describe a required computing outlay for the calculation of electrical descriptive parameters for the respective elements of the electrical circuit that is represented to the nodes and/or by the edges. A placement method is then applied to the elements of the electrical circuit (104). Next, a measure is calculated of a number, which arises on the basis of a partitioning, of cut edges and/or margin nodes for elements of the electrical circuit (105). The elements are grouped in partitions depending on the previously calculated measure (106).

11 Claims, 2 Drawing Sheets

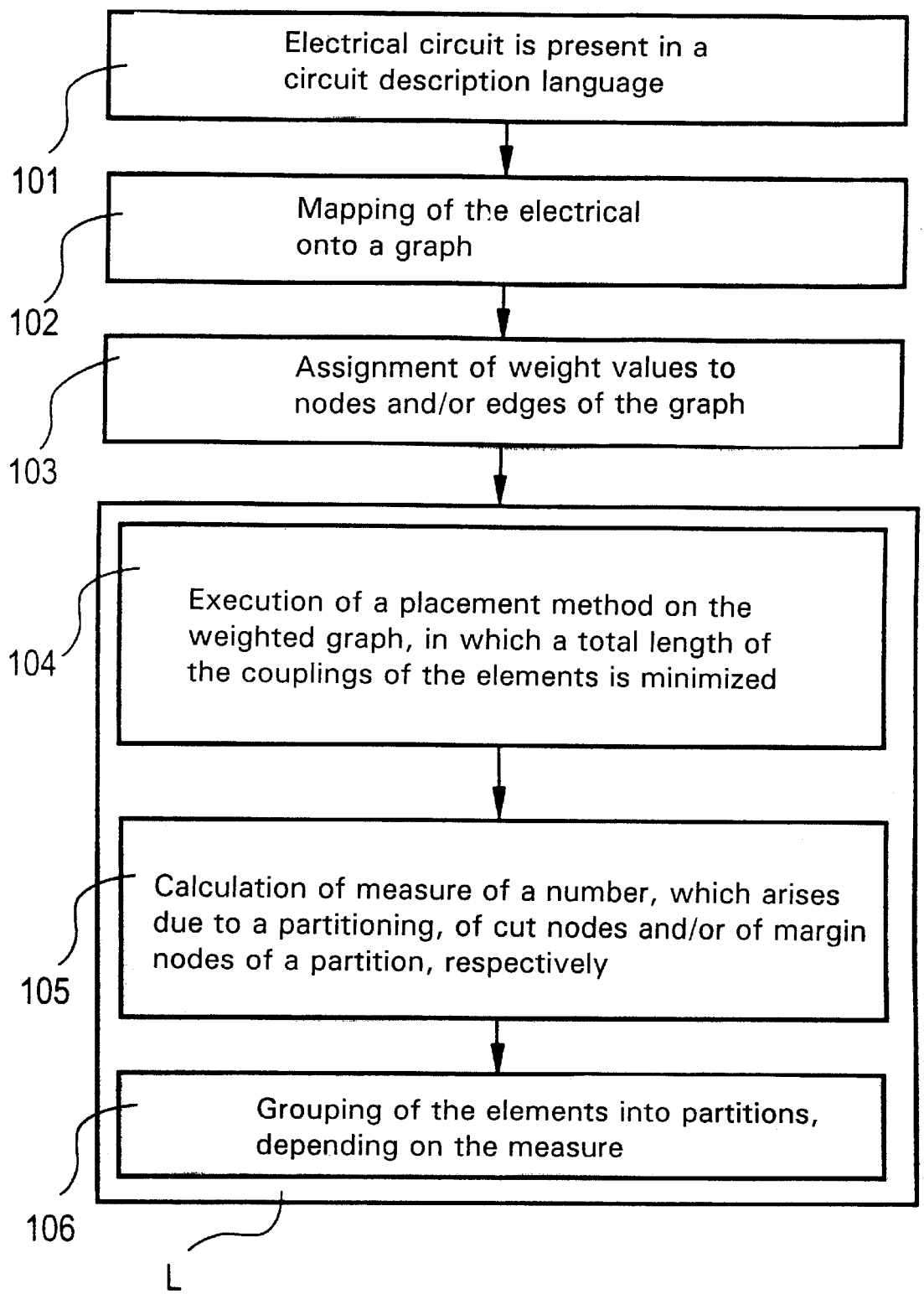

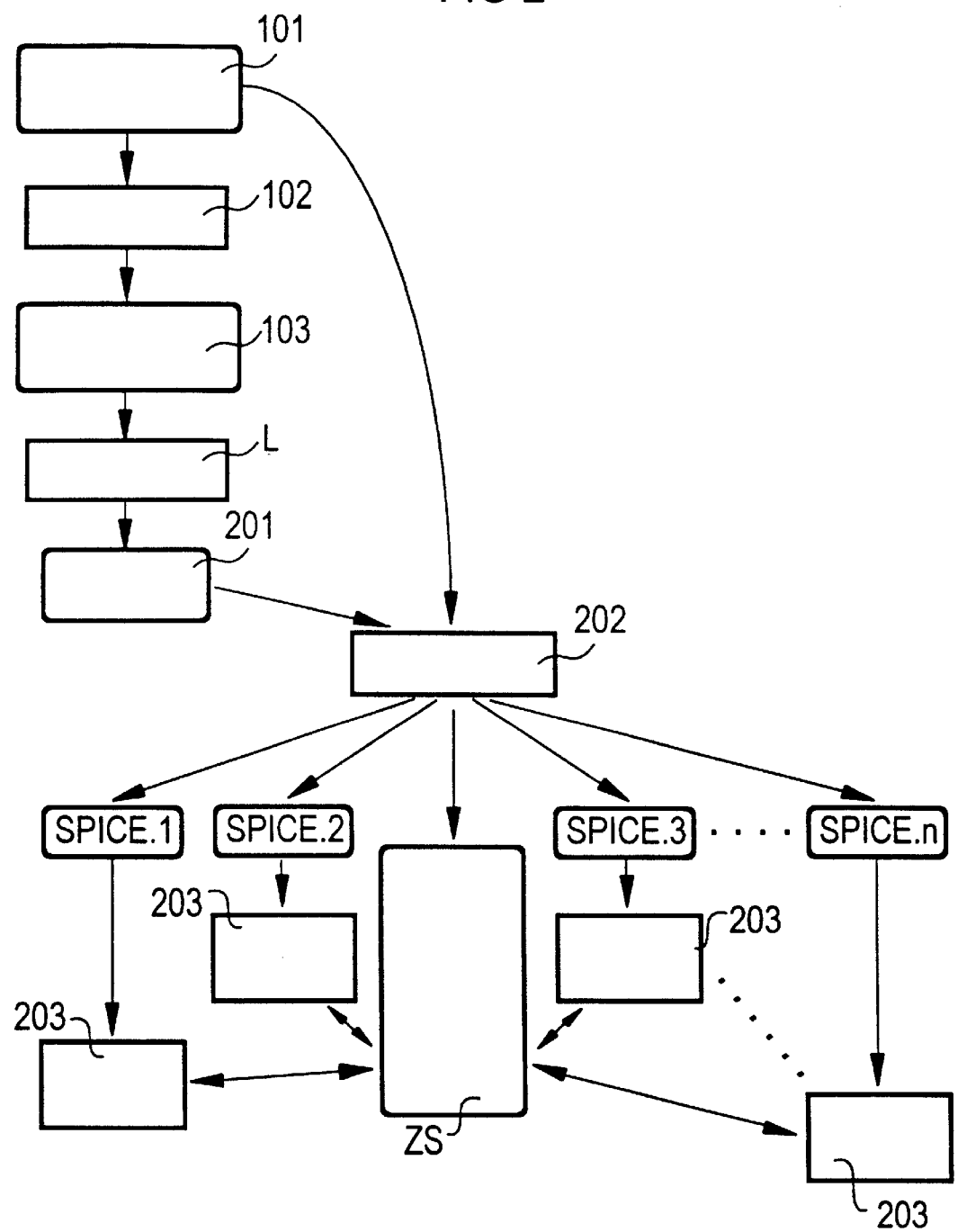

COMPUTER ASSISTED METHOD OF PARTITIONING AN ELECTRICAL CIRCUIT

BACKGROUND OF THE INVENTION

In circuit simulations of very large circuits, i.e. of circuits with a very large number of elements, a serial processing, i.e. calculation of the circuit parameters by a computer, is very time consuming. Even vector processors, which are rather expensive in their operation, require an immense demand in computing capacity and in time for calculating the electrical descriptive parameters for a circuit comprising a few 100,000 transistors.

For this reason, to avoid the serial execution of a circuit simulation, the electrical circuit can be divided into a plurality of parts, which are then respectively processed by different computers, or respectively, processors, which leads to a parallel execution of the circuit simulation.

However, in order to achieve an optimally good parallelization of the calculation of an electrical circuit descriptive parameters for the electrocircuit, it is very advantageous to consider two criteria in the partitioning of the electrical circuit into a plurality of parts. It is of considerable importance that all formed partitions of the electrical circuit are optimally equally large, in order to thereby enhance the effect that can be achieved by the parallelization. If one partition is larger than the other partitions by orders of magnitude, then the processing of the significantly larger partition in turn requires a much greater computing outlay than the processing of the other partitions. It is also important in the partitioning that optimally only a small number of connections exists between the individual partitions, since in the known methods for "parallelized" circuit simulation, the required transmission capacity, i.e. the required communication between the computers, or respectively, processors which respectively process a partition, rises with an increasing number of existing connections between the partitions.

A language for the textual description of an electrical circuit which can be processed by a computer is the circuit simulation language SPICE. One document disclosing SPICE is I. Hoefer, et al., *SPICE Analyseprogramm fur electronische Schaltungen,* Springer, Berlin (1985), pp. 7–22.

The documents U. Kleis, et al., *Doman Decomposition Methods for Circuit Simulation,* Proceedings of the $8^{th}$ Workshop on Parrallel and Distributed Simulation, PADS, Edinburgh, UK (July, 1994), pp. 183–86 U. Wever, et al., *Parallel Transient Analysis for Circuit Simulation,* Proceedings of the $29^{th}$ Annual Hawaii International Conference on System Sciences (1946), pp. 442–47 teach how a parallelized circuit simulation can be executed, provided there is an arbitrary number of partitions of the electrical circuit. The manner in which partitions can be calculated is not described in these documents.

The documents B. Reiss, *Partitioning Very Large Circuits Using Analytical Placement Techniques,* Proceedings of the $31^{st}$ ACM/IEEE Design Automation Conference (1994), pp. 646–51 J. Li, et al., *New Spectral Linear Placement and Clustering Approach,* $33^{rd}$ Design Automation Conference, Las Vegas Jun. 3–7, 1996), pp. 88–93 teach a global partitioning method on what is known as the logic level, which is also referred to as the gate level.

On the logic level, discrete events are described with which it is not possible, however, to describe constantly dynamic characteristics of an electrical circuit on what is known as the transistor level, i.e. on the actual physical level of the electrical circuit.

The results of a circuit simulation which occurs on the logic level are thus unreliable and imprecise for some applications, since an exact time characteristic, which occurs in the electrical circuit, of the electrical signals cannot be taken into account either.

Furthermore, a model description of the individual gates is needed for the circuit simulation on the gate level, whereby the circuit description with transistor models is already present for the simulation on the transistor level. The model description must be calculated before the method can be executed on the gate level.

What is known as the conjugation gradient method is taught by document G. Sigl, *Analytical Placement: A Linear or a Quadratic Objective Function?*, Proceedings of the $28^{th}$ ACM/IEEE DAC (1991), pp. 427–432.

An overview of various partitioning specifications can be found in P. Johannes, *Partioning of VLSI Circuits and Systems,* $33^{rd}$ Design and Automation Conference, Las Vegas (Jun. 3–7, 1996), pp. 83–87.

SUMMARY OF THE INVENTION

An object of the present invention is to provide a method for partitioning an electrical circuit which directly accounts for the elements of the electrical circuit on the transistor level.

To that end, in an embodiment in the invention provides a computer supported method for partitioning an electrical circuit, wherein the electrical circuit is mapped on a graph having the same topology as the electrical circuit, wherein nodes and/or edges of the graph are assigned weight values with which a required computing outlay, for the calculation of electrical descriptive parameters for elements of the electrical circuit which are represented by the respective node and/or by the respective edge, is described, wherein a method for placing the elements of the electrical circuit is applied to the elements.

wherein, in the method for placing the elements, a total length of couplings between the elements is minimized, the weight values that are assigned to the nodes and/or edges being taken into account, wherein, for the electrical circuit, a measure is calculated of a number of arising cut edges and/or arising margin nodes of partitions of the electrical circuit in the partitioning, and wherein the elements are grouped in partitions depending on the measure.

In this method, the electrical circuit is mapped on a graph which comprises the same topology as the electrical circuit. The edges and/or nodes of the graph are weighted with weight values which describe an approximately required computing outlay for the calculation of electrical descriptive parameters for the electrical circuit element that is respectively represented by the edge and/or node.

The partitions for the electrical circuit in the graph are formed in such a way that a method for placing the elements of the electrical circuit is applied to the elements, in which method a total length of couplings between the elements in the electrical circuit is minimized. In addition, a measure of the number of appearing edge nodes and/or cut edges of partitions which would respectively appear given the partitioning is calculated for the electrical circuit. The partitions are formed depending on the measure in that the elements are grouped into the individual partitions.

The method has some appreciable advantages compared to the method set forth in B. Reiss, *Partitioning Very Large Circuits Using Analytical Placement Techniques,* Proceedings of the 31st ACM/EEE Design Automation Conference (1994) pp. 664–651.

Since the method operates directly on the transistor level of the electrical circuit, the results achieved by the method in a later circuit simulation using the inventively calculated partitions are appreciably more precise and more reliable.

In an embodiment of the invention, at the beginning of the method, a grouping of elements of the electrical circuit is executed, for which it is specified that these elements are jointly assigned to one partition.

In an embodiment of the invention, in the grouping of the elements of the electrical circuit, at least one of the following specifications is applied:

elements of a controlled source, at least one controlling element, and the controlled source are jointly assigned to one partition, connection loops in the electrical circuit, they are jointly assigned to one partition, shorts must not arise due to the partitioning and/or due to a modelling of an interface.

In an embodiment of the invention, a plurality of nodes and/or edges of the graph are assigned a common weight value.

In an embodiment of the invention, the graph of the partition is mapped onto the electrical circuit, whereby the partition comprises the elements of the electrical circuit according to the executed partitioning.

In an embodiment of the invention, a plurality of partitions are formed by multiple execution of the method, and wherein the electrical descriptive parameters for the elements of the electrical circuit are calculated for each partition, at least a part of the partitions being processed on a plurality of computers and/or processors in parallel fashion.

In an embodiment of the invention, the parallel processing of the partitions is centrally controlled.

In an embodiment of the invention, at least a part of the partitions is centrally controlled in such a way that all the terminals of the respective partition are coupled only with a central control unit, and a transmission of data thus occurs only between the central control unit and at least the part of the partitions.

In an embodiment of the invention, at least a part of the terminals of the respective partition are additionally assigned a voltage source, the value of which is prescribed by the central control unit during the calculation of the electrical descriptive parameters.

In an embodiment of the invention, at least a part of the terminals of the respective partition is additionally assigned a resistor.

In an embodiment of the invention, the measure of the number of arising cut edges and/or arising margin modes is formed according to the following specification:

$$RC = \frac{C_{LR}}{|L| \cdot |R|},$$

wherein

RC designates the measure of the number of arising cut edges and/or arising margin nodes, L designates a first partition, R designates a second partition, $C_{LR}$ designates a number of couplings of the first partition with the second partition,

|L| designates a weighted number of elements which the first partition contains,

|R| designates a weighted number of elements which the second partition contains.

For predeterminable elements of the electrical circuit, it is advantageous to specify at the beginning of the method that the elements are grouped together into one partition. It is possible to guarantee on the basis of this further development that, for example, given controlled sources, both the controlling elements and the controlled sources can be processed together in one partition. Likewise, it is also possible on the basis of this development to arrange together in one partition connection loops in the electrical circuit, which arise by means of the consecutive connection of voltage-defining elements such as voltage sources and inductivities. Furthermore, it is possible in this way to avoid shorts which may potentially occur due to the partitioning and the modelling of the interfaces.

On the basis of the development of the method that a plurality of edges and/or nodes of the graph are assigned a common weight value, the execution of the method by a computer is further accelerated, since, in this development, a lower number of weight values needs to be taken into account in the framework of the method.

It is also advantageous to form a plurality of partitions for the electrical circuit, to map the corresponding graphs of the partitions on the electrical circuit again for the partitions, and to process the arising partitions of the electrical circuit on different computers, or respectively, processors in parallel fashion. By means of this parallelization, a circuit simulation of a rather large circuit can be executed appreciably more rapidly than is possible in a purely "serial" circuit simulation.

It is also advantageous in the parallelized circuit simulation to control the processing of the individual partitions centrally. In this way, a controlled circuit simulation is realized with optimally little communication outlay.

It is also advantageous to additionally provide the individual terminals of the partitions that ate coupled with components not situated in the partition with a voltage source and a resistor, whereby the electrical marginal descriptive parameters are respectively assigned to the voltage source by a central control unit which controls the parallelized processing of the partitions. On the basis of the resistor which is provided in the terminals, the convergence of the circuit simulation during the parallelized circuit simulation is guaranteed, the value of which is dynamically adjusted by the control unit.

These and other features and aspects of the invention will become clear in the following detailed description of a few typical exemplary embodiments with reference to the accompanying drawings.

BRIEF DESCRIPTION OF THE DRAWINGS

FIG. 1 is a flow diagram in which the individual steps of the method are depicted;

FIG. 2 is a sketch in which various developments of the method are depicted;

DETAILED DESCRIPTION OF THE PRESENTLY PREFERRED EMBODIMENTS

In accordance with the invention, electrical circuits which comprise a rather large number of elements can be parallelized by the division of the elements, i.e. a partitioning of the elements into an arbitrary number of partitions and a processing of the individual partitions on different computers, or respectively, processors which execute a circuit simulation. The execution of the complete circuit simulation can be appreciably accelerated in this way.

The individual partitions must be carefully determined, however, so that the parallelization is configured most optimally.

It is important here to adhere to an approximately uniform size of the partition, on the one hand, and to take care that the individual partitions do not comprise too large a number of connections "to the outside", on the other hand, such as couplings with other elements which are not located in the partition.

For processing in the framework of a circuit simulation by a computer, electrical circuits are usually present in a circuit description language 101; for example, in the language known as SPICE, which is described by L. Hoefer, et al. in *SPICE Analyseprogramm for electronische Scaltungen,* Springer, Berlin (1985), pp. 7–22.

However, the method is in no way limited to a description of the electrical circuit in a circuit description language, much less to the utilization of the specific circuit description language SPICE.

In a first step of the method 102, the electrical circuit is mapped on a graph having the same topology as the electrical circuit. This occurs on the basis of the electrical circuit that is present in the circuit description language SPICE, for example. The graph has the corresponding nodes corresponding to the topology of the electrical circuit. The individual elements of the electrical circuit are represented by nodes of the graph.

However, depending on the interpretation of the graph, it is just as possible to map the individual elements of the electrical circuit on edges between the nodes of the graph.

In a further development of the method, it is advantageous to mark individual elements of the electrical circuit at the beginning of the method, i.e. to specify for the corresponding marked elements that the marked elements are respectively assigned together to one partition later in the method. Different markings can assign different elements to different partitions. It is also provided that elements are marked only in such a way as to be so interpreted by the computer executing the method that the respectively paired elements are assigned to one partition.

It is advantageous here to consider the following specific cases of an electrical circuit, for example: If an electrical circuit contains controlled sources, such as controlled current sources or controlled voltage sources, then it is advantageous that both the controlling elements and the controlled source are contained in one partition for the subsequent circuit simulation.

Likewise, it is also advantageous to assign coupled inductivities to one common partition, respectively. It is also important to consider in a development of the method that shorts due to the partitioning must not occur and its algorithmic processing by a computer.

In a further step 103, weight values G are assigned to the nodes, or respectively, according to the interpretation of the graph, to the edges. It is described with the weight values G approximately what computing outlay is to be expected for the calculation of electrical descriptive parameters for the respective element that is represented by the nodes, or respectively, edges of the electrical circuit to which the weight value G is respectively assigned.

A measure of the required computing outlay can be seen in the number of code lines required for the calculation of the electrical descriptive parameters for the respective specific element in the framework of the circuit simulation, for example. As a rough scale, it is hereby noted that the outlay for the calculation of the electrical descriptive parameters for transistors is appreciably larger than the outlay for the calculation of the electrical descriptive parameters for an electrical resistor or for a capacitor. The selection of the weight value G is extremely uncritical, however, and merely represents an approximate quantity ratio of the required computing outlay. It is even sufficient, for example, to assign a node, or respectively, an edge representing a transistor a high weight value G, e.g. the weight value G=300, and to assign the nodes, or respectively, edges representing a resistor or a capacitor a small weight value, e.g. a weight value G=1 or even a weight value G=0.

In this context, electrical descriptive parameters refer to the corresponding currents and voltages of an element of the electrical circuit, for example.

In a further step 104, a placement method is executed on the weighted graphs and thus on the elements of the electrical circuit. With the placement method, a total length of couplings of elements of the electrical circuit is minimized.

In general, this can occur with any arbitrary placement method. For example, this can occur with the placement methods described by B. Reiss in *Partitioning Very Large Circuits Using Analytical Placement Techniques,* Proceedings of the 31$^{st}$ ACM/IEEE Design Automation Conference (1994), pp. 646–51 as well.

Below, two possibilities are detailed for utilizing the placement methods in the framework of the partitioning of elements of the electrical circuit on the transistor level.

In a first advantageous utilizable placement method, a linear objective function of the following form is used:

$$\min_{\underline{x} \in \mathcal{R}^n} \sum_{i=1}^{n} \sum_{j=1}^{n} a_{ij} |\underline{x}_i - \underline{x}_j| \quad (1)$$

with $$\sum_{i=1}^{n} \underline{x}_i = f. \quad (2)$$

The term $a_{ij}$ designates elements of an adjacency matrix $\underline{A}$, which comprises a dimension n×n. The term n designates the number of elements of the electrical circuit that are taken into account. The matrix elements $a_{ij}$ of the adjacency matrix $\underline{A}$ are formed by taking the sum of all the edges of the weighted graphs with which an element i is coupled to another element j, for example. The terms $\underline{x}_i$ and $\underline{x}_j$ respectively designate a data vector with which the spatial position, within the electrical circuit, of the respective element i, or respectively, j of the electrical circuit is designated. The term f designates a predeterminable linear limit quantity.

It can be seen from the equations (1) and (2) that this is a matter of a problem of linear programming, which, however, can be reformulated into a problem of quadratic programming using the substitution:

$$g_{ij} = \frac{a_{ij}}{|\underline{x}_i - \underline{x}_j|} \quad (3)$$

This problem can be solved quite efficiently with what is known as the conjugation gradient method. The conjugation gradient method is taught by G. Sigl in *Analytical Placement: A Linear or a Quadratic Objective Function?,* Proceedings of the 28$^{th}$ ACM/IEEEE DAC (1991), pp. 427–432.

In the framework of this method, both a one-dimensional placement and a multidimensional placement can be specified.

The better the quality of the calculated placement is, the shorter the total required length is of the couplings between the elements of the electrical circuit. This is a result of the minimization of the total length of the couplings of the elements of the electrical circuit by the placement method in the framework of the objective function.

By the reduction of the required total length of the couplings of the elements, the number of couplings between partitionings in a subsequently executed partitioning of the electrical circuit is reduced.

Since, in the special case of the conjugation gradient method described by G. Sigl in *Analytical Placement: A Linear or a Quadratic Objective Function?*, Proceedings of the 28th ACM/EEE DAC (1991), pp. 427–432, at least one cell must be assigned to a fixed position, in another development of the method, it is advantageous to respectively place in a fixed position the element which is located to the far left on the margin of the electrical circuit and to the far right on the margin of the electrical circuit. Thus, the spatial coordinates, and so the spatial vectors of these elements, are defined, and the conjugation gradient method is executed.

In a further step 105, for the elements of the electrical circuit, for each element, or respectively, for each pair of elements which are coupled to one another, a measure is respectively calculated of a number, which arises due to a possible partitioning, of cut edges of a partition, or respectively, of a number, which arises in another interpretation of the graph G, of edge nodes of a partition. This occurs with the aid of what is known as the rational cut measure RC. The rational cut measure RC can be formed according to the following specification, for example:

$$RC = \frac{C_{LR}}{|L| \cdot |R|}, \quad (4)$$

wherein

RC designates the measure of the number of arising edge nodes,

L designates a first partition,

R designates a second partition, $C_{LR}$ designates a weighted number of couplings of the first partition with the second partition,

|L| designates a weighted number of the elements which the first partition contains

|R| designates a number of the elements which the second partition contains.

Details about the manner of utilization of this measure in the framework of the method are described by L. Hagen, et al. in *Fast Spectral Methods for Ratio Cut Partitioning and Clustering*, IEEE/ACM International Conference on Computer-Aided Design (1991), pp. 10–13 for example.

To determine the partitions, it is provided that the measure RC is calculated for every possible interface of a partition within the electrical circuit between the elements of the electrical circuit. This means that the measure RC is calculated for all the elements of the electrical circuit which could be grouped in various partitions. However, to simplify the method, it is likewise provided that the measure RC is calculated only for a predeterminable number of elements.

The partitioning then respectively occurs at those locations at which the measure comprises a local minimum. Details about the course of action here are likewise described by L. Hagen, et al. in *Fast Spectral Methods for Ratio Cut Partitioning and Clustering*, IEEE/ACM International Conference on Computer-Aided Design (1991), pp. 10–13.

A possible second course of action for placing the elements and so for forming the partitions is demonstrated in chapter 3 of document [4].

It should be emphasized, however, that the placement method described B. Reiss in *Partitioning Very Large Circuits Using Analytical Placement Techniques*, Proceedings of the 31st ACM/IEEE Design Automation Conference (1994), pp. 646–51. relates only to the gate level of the description of an electrical circuit, respectively.

With the aid of the original description of the electrical circuit, in the circuit description language SPICE, for example, the partition is mapped into a syntax to be processed further by the computer, such as the circuit description language SPICE again. In this mapping, the information of the respective partition for the respective element of the electrical circuit is taken into account by the marking of the respective element, for example.

In step 106, a grouping of the elements into partitions, depending on the measure which has been calculated in step 105, is performed. The sequence of step 104, step 105 and step 106, is indicated by the label "L" in FIG. 1 and in FIG. 2.

By means of this remapping 201 (cf. FIG. 2), for the specific case of the utilization of the circuit description language SPICE, a list in turn arises with the circuit elements of the electrical circuit, and with the couplings and the respective declaration of the partition to which the respective element has been assigned.

In a development of the method, it is advantageous to execute this method for an arbitrary number of partitions; i.e., the electrical circuit is divided into an arbitrary number of partitions. In this development, according to the number of partitions formed, partition-specific lists arise with the elements of the electrical circuit in the circuit description language SPICE 202. A parallelization of the circuit simulation of the electrical circuit, which parallelization is advantageous in a development of the method, is achieved in that the electrical descriptive parameters for the elements of the electrical circuit are calculated for each partition separately, it being possible for at least one part of the partitions to be processed on a plurality of computers and/or processors in parallel fashion. This corresponds to a parallelization of the circuit simulation.

In a further development of the method, it is further provided that a common weight value is assigned to a plurality of nodes, or respectively, edges of the graph G. The required computing outlay is thereby reduced.

Methods for the parallelized circuit simulation on distributed processors, or respectively, distributed computers are taught by U. Kleis, et al. in *Domain Decomposition Methods for Circuit Simulation*, Proceedings of the 8th Workshop on Parallel and Distributed Simulation, PADS, Edinburgh, UK (July, 1994), pp. 183–86, and by U. Wever, et al. in *Parallel Transient Analysis for Circuit Simulation*, Proceedings of the 29th Annual Hawaii International Conference on System Science (1996), pp. 442–47 for example. These can be applied without restriction to the partitions formed by the method.

It is further provided in a development of the method that the parallel processing of the partitions is controlled via a central control unit ZS. This means that, for example, the communication of the individual partitions in the method of the circuit simulation such as is described by U. Kleis, et al. in *Domain Decomposition Methods for Circuit Simulation*, Proceedings of the 8th Workshop on *Parallel and Distributed Simulation*, PADS, Edinburgh, UK (July, 1996), pp. 183–86 and by U. Weveer, et al. in *Parallel Transient Analysis for Circuit Simulation*, Proceedings of the 29th Annual Hawaii International Conference on System Sciences (1996), pp. 442–47 i.e., the transmission of data occurs only between the central control unit ZS and the part of the partitions that are centrally controlled.

In FIG. 2, the parallelized processing is symbolically depicted by a plurality of SPICE files SPICE.1, SPICE.2, SPICE.3 to SPICE.N. In these SPICE files, the individual descriptions of the partitions are contained in the circuit description language SPICE.

For the respective partition, a circuit simulation is executed 203, this being controlled centrally by the central control unit ZS, for example.

In addition, it is provided in a development of the method that at least one part of the terminals of the respective partitions which are processed in the framework of the parallelized circuit simulation are additionally assigned a voltage source, to which a corresponding value is respectively assigned by the control unit ZS in the framework of the known method. To guarantee the convergence of the iterative method described by U. Kleis, et al. in *Domain Decomposition Methods for Circuit Simulation,* Proceedings of the $8^{th}$ Workshop on Parallel and Distributed Simulation, PADS, Edinburgh, UK (July, 1994), pp. 183–86, and by U. Wever, et al. in *Parallel Transient Analysis for Circuit Simulation,* Proceedings of the $29^{th}$ th Annual Hawaii International Conference on System Sciences (1996), pp. 442–47, it is advantageous to additionally provide a resistor, at least in one part of the terminals of the respective partitions, the value of which resistor is dynamically adjusted by the control unit ZS.

Although modifications and changes may be suggested by those skilled in the art, it is the intention of the inventors to embody within the patent warranted hereon all changes and modifications as reasonably and properly come within the scope of their contribution to the art.

SOURCE LITERATURE

In the framework of this document, the following publications have been cited:

[1] I. Hoefer, H. Nielinger, *SPICE Analyseprogramm für elektronische Schaltungen,* (1985) Springer, Berlin:7–22

[2] U. Wever, Q. Zheng, "Domain Decomposition Methods for Circuit Simulation, *Proceedings of the $8^{th}$ Workshop on Parallel and Distribuited Simulation,* (July 1994), PADS, Edinburgh, UK:183–86

[3] U. Wever, Q. Zheng, "Parallel Transient Analysis for Circuit Simulation," *Proceedings of the $29^{th}$ Annual Hawaii International Conference on System Sciences,* (1996):442–47

[4] B. Riess, "Partitioning Very Large Circuits Using Analytical Placement Techniques," *Proceedings of the $31^{st}$ ACM/IEEE Design Automation Conference* (1994): 646–51

[5] G. Sigl, "Analytical Placement: A Linear or a Quadratic Objective Function?" *Proceedings of the $28^{th}$ ACM/IEEE DAC* (1991): 427–432

[6] L. Hagen and A. B. Kahng, "Fast Spectral Methods for Ratio Cut Partitioning and Clustering," *IEEE/ACM International Conference on Computer-Aided Design,* (1991): 10–13

[7] Ch. Cheng, "New Spectral Linear Placement and Clustering Approach," $33^{rd}$ *Design Automation Conference,* Las Vegas (Jun. 3–7, 1996): 88–93

[8] F. Johannes, "Partitioning of VLSI Circuits and Systems" $33^{rd}$ *Design and Automation Conference,* Las Vegas (Jun. 3–7, 1996):83–87

What is claimed is:

1. Computer supported method for partitioning an electrical circuit, comprising the steps of:
   mapping the electrical circuit onto a graph having the same topology as the electrical circuit;
   assigning nodes and/or edges of the graph weight values with which a required computing outlay, for the calculation of electrical descriptive parameters for elements of the electrical circuit which are represented by the node and/or by the edge, is described;
   placing the elements of the electrical circuit,
   while minimizing a total length of couplings between the elements, taking into account the weight values that are assigned to the nodes and/or edges;
   calculating a measure of a number of cut edges and/or margin nodes of partitions of the electrical circuit arising in the partitioning; and
   grouping the elements in partitions depending on the calculated measure.

2. The method according to claim 1, wherein, at the beginning of the method, elements of the electrical circuit are grouped, for which it is specified that these elements are jointly assigned to one partition.

3. The method according to claim 2, wherein, in the grouping of the elements of the electrical circuit, at least one of the following specifications is applied:
   elements of a controlled source, at least one controlling element, and the controlled source are jointly assigned to one partition,
   connection loops in the electrical circuit are jointly assigned to one partition,
   shorts must not arise due to the partitioning and/or due to a modelling of an interface.

4. The method according to claim 1, wherein a plurality of nodes and/or edges of the graph are assigned a common weight value.

5. The method according to claim 1, comprising the steps of mapping the graph of the partition onto the electrical circuit, whereby the partition comprising the elements of the electrical circuit according to the executed partitioning.

6. The method according to claim 1, comprising the steps of
   forming a plurality of partitions by multiple executions of the method, and
   calculating electrical descriptive parameters for the elements of the electrical circuit for each partition, at least a part of the partitions being processed on a plurality of computers and/or processors in parallel fashion.

7. The method according to claim 6, wherein the parallel processing of the partitions is centrally controlled.

8. The method according to claim 7, wherein at least a part of the partitions is centrally controlled in such a way that all the terminals of the respective partition are coupled only with a central control unit, and a transmission of data thus occurs only between the central control unit and at least the part of the partitions.

9. The method according to claim 8, wherein at least a part of the terminals of the respective partition are additionally assigned a voltage source, the value of which is prescribed by the central control unit during the calculation of the electrical descriptive parameters.

10. The method according to claim 9, wherein at least a part of the terminals of the respective partition is additionally assigned a resistor.

11. The method according to claim 1,
    wherein the measure of the number of arising cut edges and/or arising margin nodes is formed according to the following specification:

$$RC = \frac{C_{LR}}{|L| \cdot |R|},$$

wherein
    RC designates the measure of the number of arising cut edges and/or arising margin nodes,
    L designates a first partition,
    R designates a second partition,
    $C_{LR}$ designates a number of couplings of the first partition with the second partition,
    |L| designates a weighted number of elements which the first partition contains,
    |R| designates a weighted number of elements which the second partition contains.

* * * * *